(12) United States Patent
Lin et al.

(10) Patent No.: US 10,528,862 B1
(45) Date of Patent: Jan. 7, 2020

(54) NEURAL NETWORK SYSTEM AND METHOD FOR CONTROLLING THE SAME

(71) Applicant: MACRONIX INTERNATIONAL CO., LTD., Hsinchu (TW)

(72) Inventors: Yu-Yu Lin, New Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/222,222

(22) Filed: Dec. 17, 2018

Related U.S. Application Data

(60) Provisional application No. 62/703,447, filed on Jul. 26, 2018.

(51) Int. Cl.
| | | |
|---|---|---|
| *G11C 16/04* | (2006.01) | |
| *G06N 3/02* | (2006.01) | |
| *G11C 16/08* | (2006.01) | |
| *H01L 29/788* | (2006.01) | |
| *G11C 16/26* | (2006.01) | |
| *H01L 27/11524* | (2017.01) | |
| *G11C 16/10* | (2006.01) | |

(52) U.S. Cl.
CPC ........... *G06N 3/02* (2013.01); *G11C 16/0483* (2013.01); *G11C 16/08* (2013.01); *G11C 16/10* (2013.01); *G11C 16/26* (2013.01); *H01L 27/11524* (2013.01); *H01L 29/7881* (2013.01)

(58) Field of Classification Search
CPC .................................................. G11C 16/0483
USPC ..................................................... 365/185.17
See application file for complete search history.

(56) References Cited

U.S. PATENT DOCUMENTS

| | | | |
|---|---|---|---|
| 2004/0168145 A1* | 8/2004 | Forbes | H01L 27/115 438/257 |
| 2019/0035449 A1* | 1/2019 | Saida | G11C 11/1673 |
| 2019/0221263 A1* | 7/2019 | Lee | H01L 27/24 |

* cited by examiner

*Primary Examiner* — Hoai V Ho
(74) *Attorney, Agent, or Firm* — McClure, Qualey & Rodack, LLP

(57) ABSTRACT

A neural network system includes a doping well having a first conductivity, a memory string having a plurality of memory cells each include a gate and a source/drain with a second conductivity disposed in the doping well, a buried channel layer having the second conductivity and disposed in the doping well, a word line driver used to apply input voltages corresponding to a plurality of input variations of terms in the sum-of-products operations, a voltage sensing circuit used to apply a constant current into the memory string and to sensing a voltage, a controller used to program/read the memory cells for acquiring a plurality of threshold voltages corresponds to weights of the terms in the sum-of-products operations. When programing/reading the threshold voltages, a first bias voltage is applied to the first doping well; and when sensing the voltage, a second bias voltage is applied to the first doping well.

7 Claims, 8 Drawing Sheets

NEURAL NETWORK SYSTEM AND METHOD FOR CONTROLLING THE SAME

This application claims the benefit of U.S. provisional application Ser. No. 62/703,447, filed Jul. 26, 2018, the subject matter of which is incorporated herein by reference.

BACKGROUND

Technical Field

The present invention relates to circuitry that can be used to perform sum-of-products operations and the method for controlling the same, especially to a neural network (NN) system applying the circuitry and the method for controlling the same.

Description of the Related Art

In neuromorphic computing systems, machine learning systems and circuitry used for some types of computation based on linear algebra, the sum-of-products function can be an important component. The function can be expressed as follows:

$$f(x_i) = \sum_{i=1}^{M} W_i x_i$$

In this expression, each product term is a product of a variable input $X_i$ and a weight $W_i$. The weight $W_i$ can vary among the terms, corresponding for example to coefficients of the variable inputs $X_i$.

The sum-of-products function can be realized by an operation of a non-volatile memory (NVM) device, such as a NAND flash memory device, having a cross-points array architectures in which the electrical characteristics of memory cells effectuate the sum-of-products function.

For high-speed implementations, it is desirable to reduce the buried channel resistance of the memory cells for increasing the sensing current passing the memory cells strings of the NVM device during a sensing step of the sum-of-products operation. However, when the buried channel resistance of the memory cells is too low, the difference of the OFF-state current and the On-state current may get close that might result to small read window for determine the threshold voltage Vt of the memory cells.

Therefore, there is a need of providing an NN system and the method for controlling the same to obviate the drawbacks encountered from the prior art.

SUMMARY

One aspect of the present disclosure is to provide an NN system used to perform sum-of-products operations, wherein the NN system includes an NVM device, a word line driver, a voltage sensing circuit and a controller. The NVM device includes a substrate, a first doping well, a memory cells string and a buried channel layer. The first doping well having a first conductivity is disposed in the substrate. The memory cells string includes a plurality of NVM cells electrically connected in series, each of the NVM cells has a gate a source and drain, wherein the source and the drain disposed in the first doping well are separated from each other and both have a second conductivity. The buried channel layer having the second conductivity is disposed in the first doping well to make the source and the drain disposed between the gate and the buried channel layer. The word line driver is electrically connected to the gate of each NVM cells to apply a plurality of input voltages corresponding to a plurality of input variations of terms in the sum-of-products operation. The voltage sensing circuit is connected to the memory cells string to apply a constant current into the memory cells string and to sensing a voltage of the memory cells string. The controller is used to program or read the NVM cells for acquiring a plurality of threshold voltages, wherein the sensed voltage and the threshold voltages correspond to weights of the terms in the sum-of-products operations. When the threshold voltages of the NVM cells are programed or read, a first bias voltage is applied to the first doping well for increasing a variable resistance of the buried channel layer; and when the step of sensing the voltage of the memory cells string is performed, a second bias voltage is applied to the first doping well for reducing the variable resistance.

Another aspect of the present disclosure is to provide a method for controlling an NN system used to perform sum-of-products operations, wherein the method includes steps as follows: an NVM device including a substrate, a first doping well, a memory cells string and a buried channel layer is firstly provided, wherein the first doping well having a first conductivity is disposed in the substrate; the memory cells string includes a plurality of NVM cells electrically connected in series, each of the NVM cells has a gate a source and drain, the source and the drain disposed in the first doping well are separated from each other and both have a second conductivity; the buried channel layer having the second conductivity is disposed in the first doping well to make the source and the drain disposed between the gate and the buried channel layer. A controller is provided used to program or read the NVM cells for acquiring a plurality of threshold voltages. A word line driver is then provided to electrically connect to the gate of each NVM cells for applying a plurality of input voltages corresponding to a plurality of input variations of terms in the sum-of-products operation. A voltage sensing circuit connected to the memory cells string is provided to apply a constant current into the memory cells string and to sensing a voltage of the memory cells string, wherein the sensed voltage and the threshold voltages correspond to weights of the terms in the sum-of-products operations. When the threshold voltages of the NVM cells are programed or read, a first bias voltage is applied to the first doping well for increasing a variable resistance of the buried channel layer; and when the step of sensing the voltage of the memory cells string is performed, a second bias voltage is applied to the first doping well for reducing the variable resistance.

In accordance with the aforementioned embodiments of the present disclosure, an NN system having a plurality of NVM cells strings and used to perform sum-of-products operations is provided. By applying different bias voltages to a doping well in which the NVM cells strings are formed during different operations (e.g. during the programing or reading operations for acquiring the threshold voltages of the NVM cells or the sum-of-products operations) to alter a variable resistance of the buried channel layer, the resistance of the NVM cells strings can be increased during the programing or reading operations, and the resistance of the NVM cells strings can be decreased during the sum-of-products operations. As a result, the difference of the OFF-state current and the On-state current of the NVM cells can be enlarged and a wider read window during the programing or reading operations for determine the threshold voltage of the NVM cells can be obtained. Alternatively, the resistance of the NVM cells strings can be decreased during the sum-of-products operations, and the sensing current can be significantly increased to improve the speed of the sum-of-products.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1:
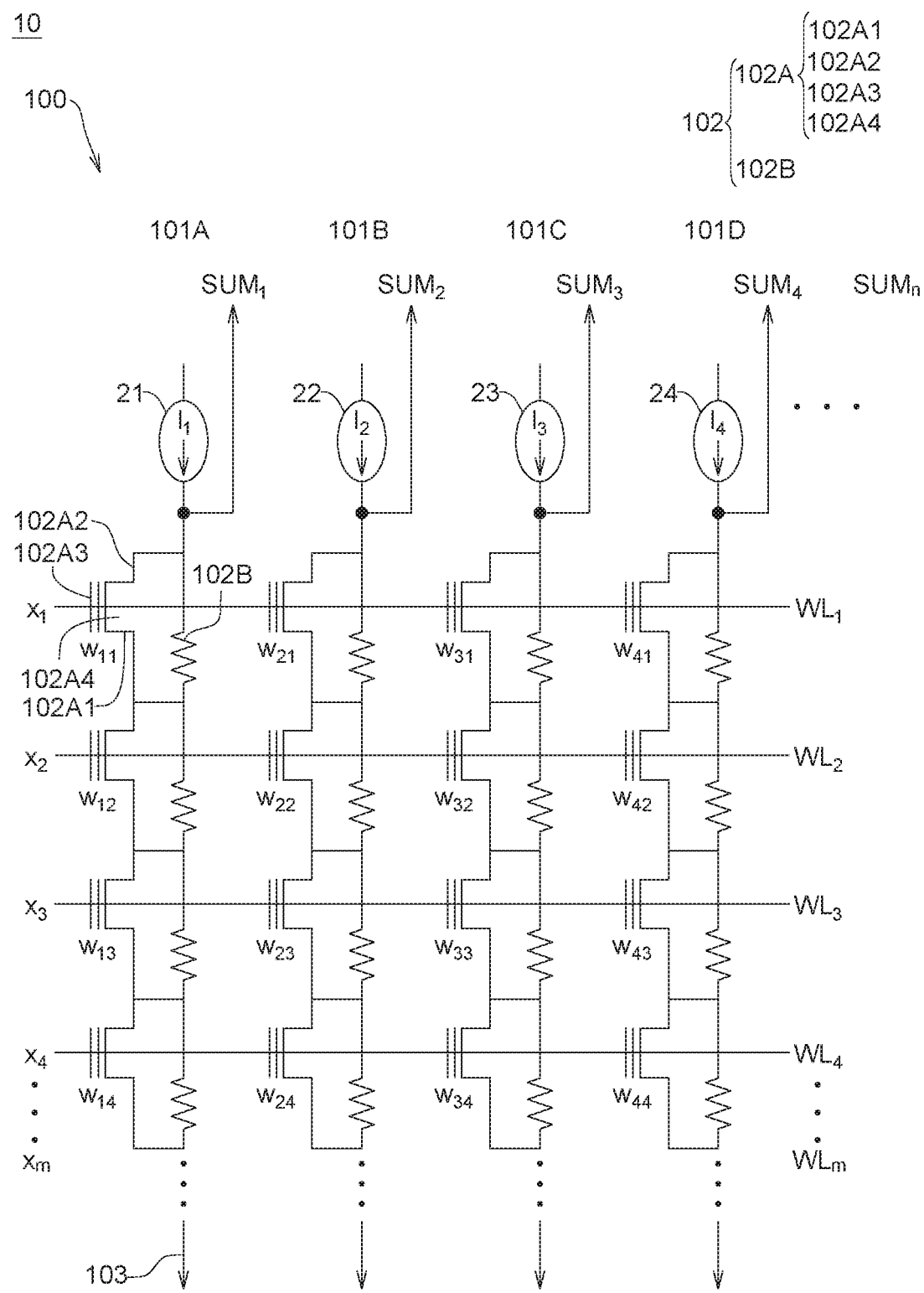
FIG. 1 is a simplified circuit diagram illustrating a portion of an NN system suitable for performing sum-of-products operations in accordance with one embodiment of the present disclosure.

The embodiments as illustrated below provide an NN system and the method for controlling the same to provide high-speed implementations of sum-of-products operations. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

FIG. 1 is a simplified circuit diagram illustrating a portion of an NN system 10 suitable for performing sum-of-products operations in accordance with one embodiment of the present disclosure. The NN system 10 includes at least one NVM device 100, and the NVM device 100 includes a cells array constituted by plurality of memory cells strings (such as the memory cells strings 101A to 101D) each includes a plurality of NVM cells 102. Each of the NVM cells 102 has a transistor 102A and a resistor 102B electrically in parallel with the transistor 102A through the source 102A1 and the drain 102A2 of the transistor 102A.

In present embodiment, the cells array of the NVM device 100 includes four memory cells strings, where each memory cells string includes four NVM cells 102 electrically connected in series between a summing node (one of the summing nodes SUM1 to SUM4), and a reference line (such as ground). Four word lines $WL_1$ to $WL_4$ are respectively coupled to the gate 102A3 of the NVM cells 102 in each of the memory cells strings 101A to 101D.

As indicated in the figure, there can be any number of columns and summing nodes up to $SUM_n$, and any number of word lines up to $WL_m$. Each of the NVM cells 102 disposed at column n and row m has a variable resistance corresponding to a weight $W_{nm}$ of one term in the sum-of-products operations, wherein the weight $W_{nm}$ may serve as a function of the programmable threshold Vt of the transistor 102A, the resistance $R_{nm}$ of the resistor 102B in the corresponding NVM cells 102, and the constant current $I_n$ (such as the current $I_1 \cdot I_2 \cdot I_3 \cdot I_4 \ldots$) applied to the corresponding memory cells string (one of the memory cells strings 101A to 101D).

A voltage applied to the word lines $WL_1$ to $WL_4$ corresponds to the variable inputs $X_1$ to $X_4, \ldots X_m$. In this manner, the variable resistance of each of the NVM cells 102 in one of the memory cells strings 101A to 101D is a function of a voltage applied on the word line to the gate 102A3 of the corresponding NVM cell 102, a threshold Vt of the transistor 102A in the corresponding NVM cells 102, the current passing through the corresponding NVM cells 102 and the resistor 102B.

The summing nodes ($SUM_1$ to $SUM_4, \ldots SUM_n$) are coupled to a voltage sensing sense amplifier (not shown) to generate a signal representing the sum-of-products output of each of the memory cells strings 101A to 101D. A current source 21-24 is coupled to each of the memory cells strings 101A to 101D to apply a constant current $I_n$ (such as the current $I_1 \cdot I_2 \cdot I_3 \cdot I_4 \ldots$) to each string during the sensing operation. In the present embodiment, the constant current $I_n$ applied to the source 102A1 has a current amplitude that is adjustable depending on the voltage range of the voltage sense amplifier, and the resistance values in the NVM cell 102, so that a usable range of voltages $V_n$ can be generated on the memory cells strings 101A to 101D for supply to the summing node $SUM_1$ to $SUM_4$ for performing sum-of-products operations.

The transistor 102A of the NVM cell 102 can be implemented using a floating gate memory cell, a split gate floating gate memory cell, a dielectric charge trapping memory cell, such as a SONOS device or other types of dielectric charge trapping cells known as for example BE-SONOS and TANOS, and a split gate, dielectric charge trapping memory cell. Other programmable memory cell technologies, such as phase change memory, metal oxide memory, and so on, may be utilized as well.

Figure 2:
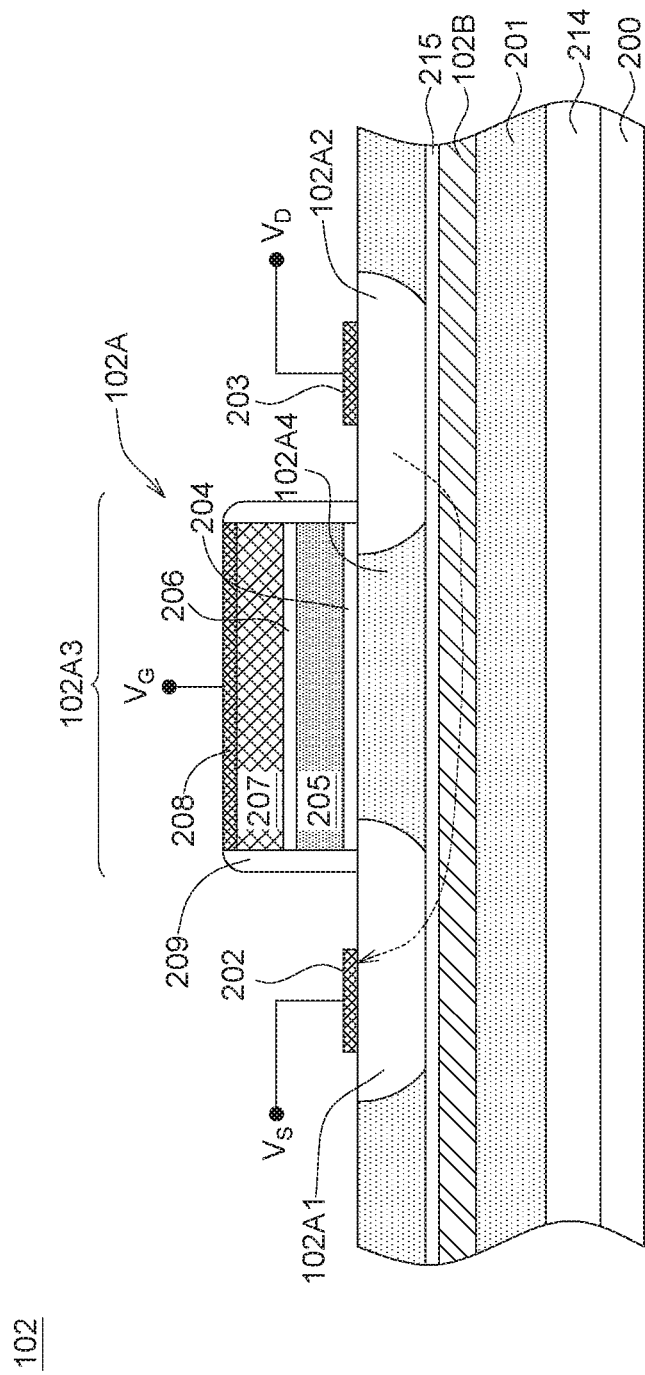
FIG. 2 is a cross-sectional view illustrating one single NVM cell of the NVM device as depicted in FIG. 1.

In the present embodiment, the transistor 102A can be a floating gate memory cell. The resistor 102B can be implemented by a buried doping area formed under the source 102A1 and the drain 102A2 of the transistor 102A using an ion implantation process, wherein the resistor 102B is connected in parallel with the channel reg ion 102A4 of the transistor 102A. FIG. 2 is a cross-sectional view illustrating one single NVM cell 102 of the NVM device 100 as depicted in FIG. 1. In the present embodiment, the NVM cell 102 is formed on a first doping well 201 disposed in the substrate 200, wherein the source 102A1, the drain 102A2 and the resistor 102B are formed in the first doping well 201. A source terminal 202 and a drain terminal 203 are formed on the top surfaces of the source 102A1 and the drain 102A2 respectively, and coupled to external voltage sources for applying the source 102A1 and the drain 102A2 a source voltage $V_S$ and a drain voltage $V_D$.

The substrate 200 can be a p-type substrate. The first doping well 201 can be implemented by a p-type ion implantation performed on the substrate 200. The resistor 102B can be implemented as a buried channel layer (hereinafter referred to as the buried channel layer 102B) formed by an n-type ion implantation performed on the substrate 200. The source 102A1 and the drain 102A2 can be implemented as two n-type doping areas formed another n-type ion implantation in the substrate 200. Wherein the buried channel layer 102B is disposed under the source 102A1 and the drain 102A2. A p-type channel region 102A4 of the transistor 102A can be defined between the source 102A1 and the drain 102A2.

The gate 102A3 is a multi-layer stacking structure including a gate dielectric layer 204 overlying the channel region 102A4, a floating gate polysilicon layer 205 disposed over the gate dielectric layer 204, an inter-poly dielectric 206 is disposed over the floating gate polysilicon layer 205 and a control gate polysilicon layer 207 disposed over the inter-poly dielectric 206. In some embodiments of the present disclosure, the inter-poly dielectric 206 can be implemented by a multilayer structure comprising silicon oxide, silicon nitride, and silicon oxide layers (ONO). The gate 102A3 may further include a contact layer 208 formed over the control gate polysilicon layer 207 and spacer 209 formed along the sidewalls of the multi-layer stacking structure.

In some embodiments of the present disclosure, NVM cell 102 may further include a second doping well 214 and a doping guard layer 215. The second doping well 214 is formed in the substrate 200 and surrounding the first doping well 201 used for preventing current leakage during the operations. The doping guard layer 215 is formed in the first doping well 201 and disposed between the buried channel layer 102B and the p-type channel region 102A4 (the source 102A1 and the drain 102A2). In the present embodiment, the second doping well 214 can be implemented by an n-type ion implantation performed on the substrate 200. The doping guard layer 215 can be implemented by a p-type ion implantation performed on the substrate 200, wherein the doping guard layer 215 has a higher p-type impurity concentration than the p-type channel region 102A4 helping to shield the buried channel layer 102B from the gate voltage $V_G$, and maintain the stability of the parallel resistance value.

In FIG. 2, the current path 212 illustrates the buried resistor current $I_B$ passing through the resistor (buried channel layer) 102B, the source 102A1 and the drain 102A2 when the transistor 102A is on an Off-state. The current path 213 illustrates the surface channel current $I_S$ passing through the channel region 102A4, the source 102A1 and the drain 102A2 when the charge trapped in the floating gate is activated by the gate voltage $V_G$ in combination with the source voltage $V_S$. Thus, the NVM cell 102 has a variable resistance (or variable conductance) that is a function of the resistance of the resistor (buried channel layer) 102B, and the resistance of the channel of the transistor 102A. The resistance of the channel of the transistor 102A is a function of the gate voltage $V_G$, and of the charge trapped in the floating gate.

While the gate-to-source voltage $V_{GS}$ is less than the threshold voltage Vt, current can flow in the buried channel layer 102B but no transistor channel ("surface channel") is formed, allowing only current $I_B$ in the buried channel layer 102B. Thus, the current passing through the NVM cell 102 is equal to $I_B$ and the resistance of the NVM cell 102 is equal to the drain-to-source voltage $V_{DS}$ divided by the current $I_B$.

While the gate-to-source voltage $V_{GS}$ is greater than the threshold voltage Vt, both the surface channel current $I_S$ and the buried resistor current $I_B$ are induced. Thus, the current $I_n$ passing through the NVM cell 102 is equal to the sum $I_S+I_B$, and the cell resistance is equal to the drain-to-source voltage $V_{DS}$ divided by the current $I_n$.

Figure 3A:
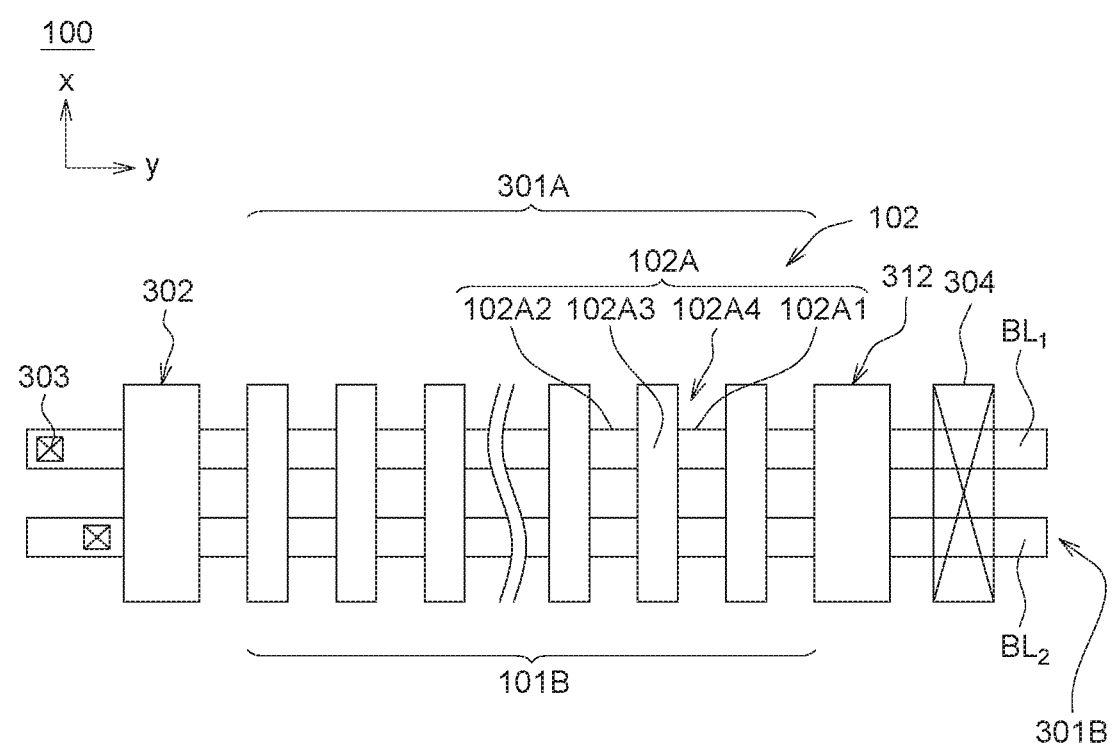
FIG. 3A is a top view illustrating a portion of an NVM device in accordance with one embodiment of the present disclosure.
Figure 3B:
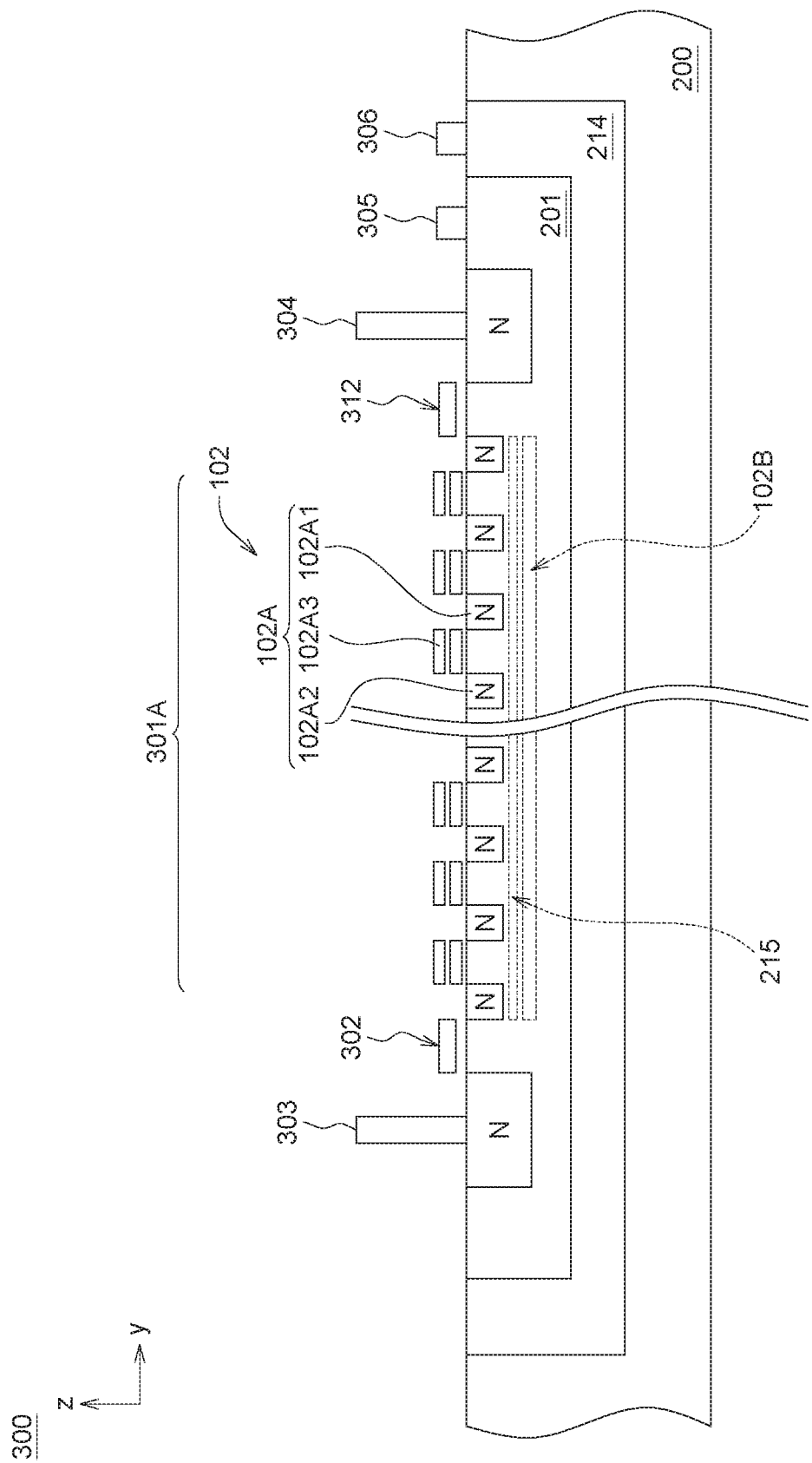
FIG. 3B is a cross-sectional view illustrating a portion of the NVM device as depicted in FIG. 3A.

FIG. 3A is a top view illustrating a portion of an NVM device 100 in accordance with one embodiment of the present disclosure. FIG. 3B is a cross-sectional view illustrating a portion of the NVM device 300 as depicted in FIG. 3A. A plurality of the NVM cells 102 as depicted in FIG. 2 can be electrically connected in series to form a memory cells string (the memory cells string 301A as depicted in FIG. 3A), and a plurality of the same kind of the memory cells string 301A can be integrated to form the NVM device 300.

In the present embodiment, the memory cells strings of the NVM device 300 (to take the memory cells string 301A as an example, see FIG. 3B) are formed in the substrate 200. The memory cells string 301A includes a plurality of gate 102A3, a multi-layer stacking structure, overly the substrate 200 and each connected to a word line (not shown). The source 102A1 and the drain 102A2 of each NVM cells 102 may be implemented by an n-type doping area N formed in the substrate 200. The series connection of two adjacent NVM cells 102 is implemented by using a common n-type doping area N to serve as the source 102A1 of one of the two NVM cells 102 and the drain 102A2 of the other one of the two NVM cells 102. The buried channel layer 102B and the doping guard layer 215 of one of the two adjacent NVM cells 102 are respectively connected to the buried channel layer 102B and the doping guard layer 215 of the other one of the two NVM cells 102.

String select transistor 302 and 312 are disposed on opposing ends of the memory cells string 301A electrically connected in series to the two NVM cells 102 disposed on opposing ends of the memory cells string 301A, respectively. The string select transistor 302 is connected to a bit line BL1 through a bit line contact 303 and the string select transistor 312 is connected to a common source line (not show) through a common source contact 304. The neighbor memory cells string 301B can be also connected to a bit line BL2 and the common source line by the same way.

In some embodiments of the present disclosure, sum-of-products operations can utilize very large arrays including thousands or millions of the memory cells string 301A. In sum-of-products operations, the resistance of the NVM cells 102 including in the same memory cells string 301A can represent a product of a variable input $X_i$ and a weight $W_i$, wherein the variable input $X_i$ can be represented by the gate voltage $V_G$, and the weight W can be represented by the function of the charge trapped in the NVM cells 102, the resistance of the resistor (buried channel layer) 102B, and the current passing the corresponding NVM cells 102.

For example, in one embodiment, the weight W can be a binary value which represents to the state of the NVM cell 102 operated in one of ON and OFF states. When the input value is greater than the threshold voltage Vt of the NVM cell 102, the NVM cell 102 is turn on, and the weight is "1". Alternatively, when the input value is lower than threshold voltage Vt of the NVM cell 102, the NVM cell 102 is turn off, and the weight is "0".

Figure 4:
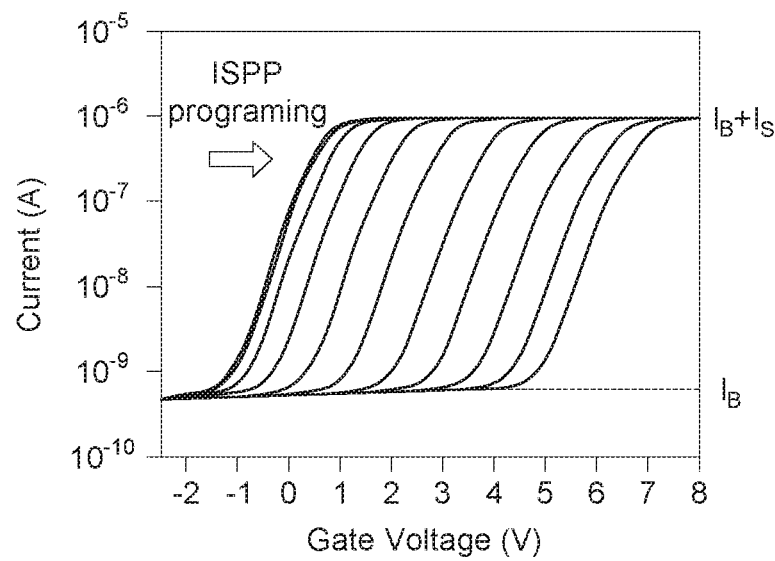
FIG. 4 is a curve diagram illustrating the relation between the gate voltage and the current passing through an NVM cell that is subjected to a plurality of increment step programming pulses (ISPP).

Since the weight $W_i$ is correlation with the threshold Vt of the NVM cell 102, thus programing and read operation for determining the of the NVM cell 102 is necessary during the sum-of-products operations. FIG. 4 is a curve diagram illustrating the relation between the gate voltage and the current passing through an NVM cell 102 that is subjected to a plurality of increment step programming pulses (ISPP).

As discussed above, when the NVM cell 102 is at an ON-state, the of the NVM cell 102 has a resistance at a low level, and a higher pass current equal to the sum of the surface channel current $I_S$ and the buried resistor current $I_B$ ($I_B+I_S$); alternatively, when the NVM cell 102 is at an OFF-state, the of the NVM cell 102 has a resistance at a high level, and a lower pass current equal to the buried resistor current $I_B$. The threshold voltage Vt of the NVM cell 102 can be thus determined by the switch of the pass current.

However, if the resistance of the resistor (buried channel layer) 102B is too high, the sensing current passing through the NVM cells 102 would be too small to make the memory cells string 301A have enough current passing there through under a limited reading voltage, therefore the sensing speed of the sum-of-products operations would be deteriorated. On the other hand, if the resistance of the resistor (buried channel layer) 102B is too low, the buried resistor current $I_B$ passing through the NVM cells 102 would be increased, that might result to small read window for the threshold voltage Vt sensing. There is a dilemma of tuning the buried channel resistance.

Figure 5:
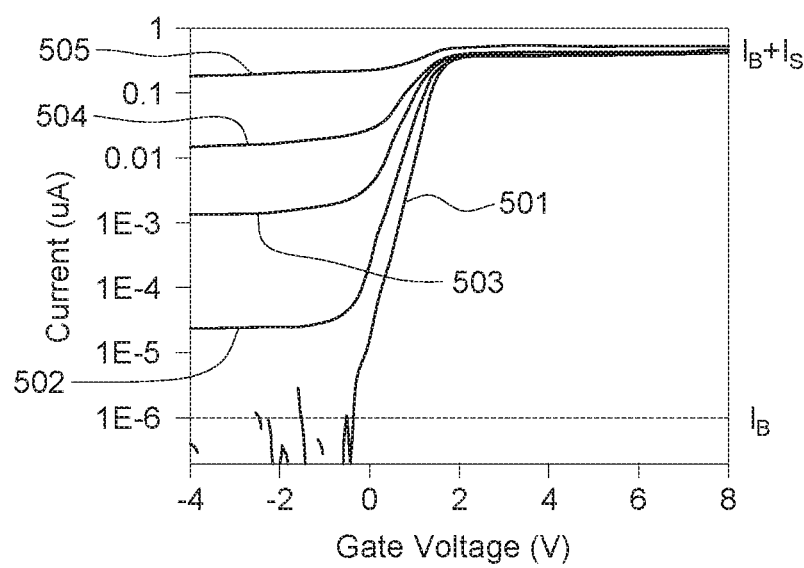
FIG. 5 is a curve diagram illustrating the relation between the gate voltage and the current passing through an NVM cell as depicted in FIG. 2 when a plurality of bias voltages are applied on the first doping well of the NVM cell during a sensing operation using a fixed reading voltage.

FIG. 5 is a curve diagram illustrating the relation between the gate voltage and the current passing through an NVM cell 102 as depicted in FIG. 2 when a plurality of bias voltages, such as 0V, 0.3 V, 0.5V, 0.6V and 0.7V are applied on the first doping well 201 of the NVM cell 102 during a sensing operation using a fixed reading voltage, such as 0.1V. The curves 501 to 505 respectively represent the gate voltage-current curves of the NVM cell 102 subjected to the bias 0V, 0.3 V, 0.5V, 0.6V and 0.7V.

As shown in FIG. 5, when the NVM cell 102 is in OFF state, the buried resistor current $I_B$ passing through the NVM cell 102 may be increased in multiples (e.g. from $10^{-6}$ μA to 0.1 μA) as the rises of the forward bias (from 0V to 0.7V) applied to the first doping well 201. Such that, it can be indicated that by applying the first doping well 201 of the NVM cell 102 a forward-biased voltage, the resistance of the of the resistor (buried channel layer) 102B of the NVM cell 102 can be deceased and the buried resistor current $I_B$ can be increased. As a result, the speed of the sum-of-products can be improved.

Figure 6A:
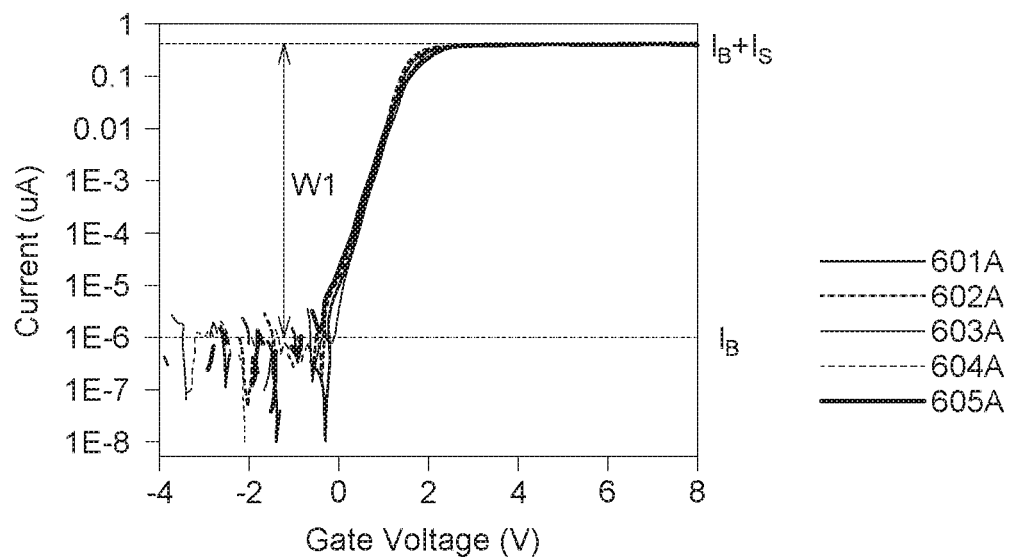
FIG. 6A is a curve diagram illustrating the relation between the gate voltage and the current passing through a plurality of NVM cells as depicted in FIG. 2 during a sensing operation using a reading voltage of 0.1V.
Figure 6B:
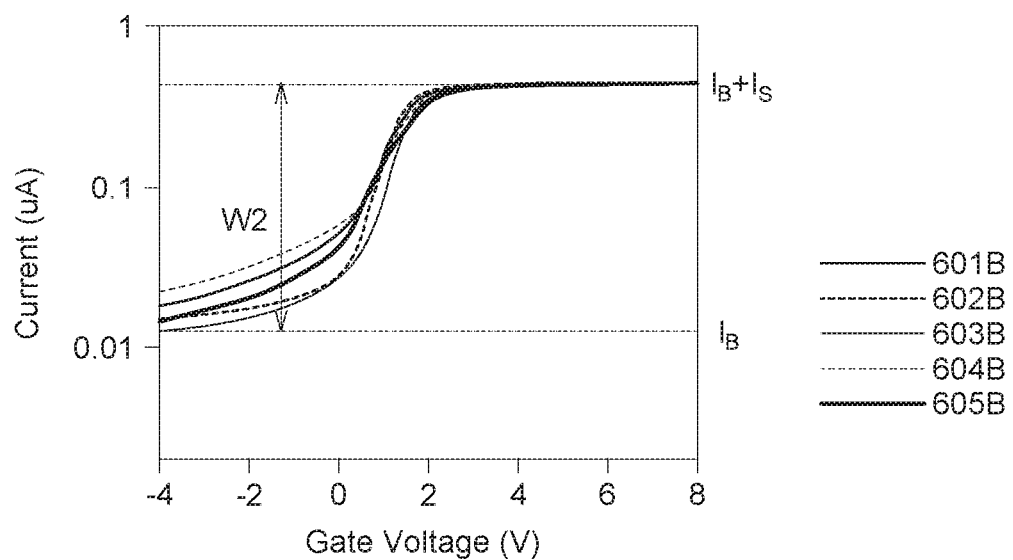
FIG. 6B is a curve diagram illustrating the relation between the gate voltage and the current passing through a plurality of NVM cells as depicted in FIG. 2 when a bias voltage of 0.7V is applied on the first doping well of the NVM cells during a sensing operation using a reading voltage of 0.1V.

FIG. 6A is a curve diagram illustrating the relation between the gate voltage and the current passing through a plurality of NVM cells 102 as depicted in FIG. 2 during a sensing operation using a reading voltage of 0.1V. The curves 601A to 605A respectively represent the gate voltage-current curves of the NVM cell 102 that are not subjected to the bias voltage. FIG. 6B is a curve diagram illustrating the relation between the gate voltage and the current passing through a plurality of NVM cells 102 as depicted in FIG. 2 when a bias voltage of 0.7V is applied on the first doping well 201 of the NVM cells 102 during a sensing operation using a reading voltage of 0.1V. The curves 601B to 605B respectively represent the gate voltage-current curves of the NVM cells 102 subjected to the bias voltage of 0.7V.

As shown in FIG. 6A, when the bias voltage applied on the first doping well 201 of the NVM cells 102 during the sensing operation is 0V, the current passing through the NVM cells 102 can steeply increase from $10^{-6}$ μA to 0.1 μA within a gate voltage ranging from 0V to 0.8V. Such that a wider read window W1 is provided, and the threshold voltage $V_t$ of the NVM cells 102 can be determined more easily by finding the slope position P of the curves 601A to 605A.

As shown in FIG. 6B, when the bias voltage applied on the first doping well 201 of the NVM cells 102 during the sensing operation is 0.7V, the current passing through the NVM cells 102 may range from 0.01 μA to 0.5 μA within a gate voltage ranging from 0V to 0.8V. Since the current in the FIGS. 6A and 6B are presented in a logarithmic scale, thus the curves 601B to 605B of FIG. 6B may have narrower read window W2 for determining the threshold voltage $V_t$ of the NVM cells 102, in comparison to the curves 601A to 605A of FIG. 6A. The more bias voltage applied on the first doping well 201 of the NVM cells 102, the harder to determine the threshold voltage $V_t$ of the NVM cells 102.

In some embodiment of the present disclosure, the buried channel layer 102B and the buried resistor current $I_B$ can be dynamically adjust without altering the doping concentration of the buried channel layer 102B during different operations (e.g. during the programing or reading operations for determining the threshold voltages Vt or during the sum-of-products operations) by applying different bias voltages to the first doping well 201. Such that, high-speed implementations of sum-of-products operations can be remained and the reading window of the NVM cells 102 may not be deteriorated.

For example, a reverse-biased voltage (a first bias voltage) is applied to the n-type first doping well 201 of the NVM cells 102 through a conductive contact 305 during the programing or reading operations for determining the threshold voltages Vt of the NVM cells 102; and a forward-biased voltage (a second bias voltage) is applied to the first doping well 201 of the NVM cells 102 through the conductive contact 305 during sum-of-products operations. In one embodiment, the first bias voltage ranges from −2V to the second bias voltage.

In some embodiments, while the first bias voltage is applied to the n-type first doping well 201 of the NVM cells 102, another reverse-biased voltage (a third bias voltage) can be applied to the p-type second doping well 214 of the NVM cells 102 through a conductive contact 306; and while the second bias voltage is applied to the n-type first doping well 201 of the NVM cells 102, another forward-biased voltage (a fourth bias voltage) can be applied to the p-type second doping well 214 of the NVM cells 102 through the conductive contact 306. The third bias voltage is greater than the first bias voltage, and the fourth bias voltage is greater than the second bias voltage.

Figure 7:
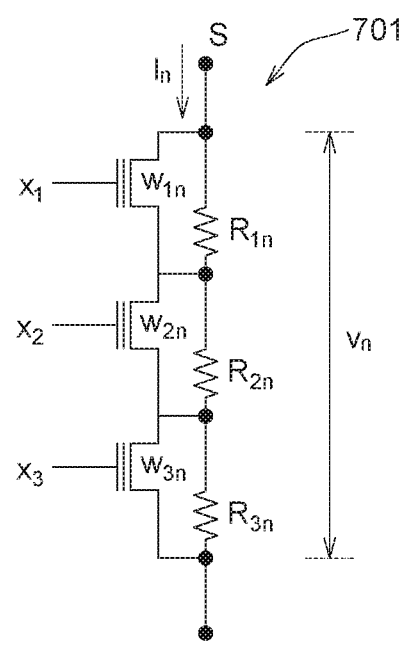
FIG. 7 illustrates a method for performing sum-of-products operations using a memory cell string having three NVM cells in accordance with one embodiment of the present disclosure.

An exemplary description of a method for performing sum-of-products operations using the memory cell string 701 having three NVM cells 102, as shown in FIG. 7, is provided as follows. A constant current $I_n$ is applied to the memory cell string 701, and three different gate voltages $X_1$, $X_2$ and $X_3$ are respectively applied to the gate 102A3 of the three NVM cells 102. The voltages $V_n$ generated on the memory cells string 701 depends upon the weights $W_{1n}$, $W_{2n}$ and $W_{3n}$, the resistance $R_{1n}$, $R_{2n}$ and $R_{3n}$ of the NVM cells 102 as well as the gate voltages $X_1$, $X_2$ and $X_3$ applied to the three NVM cells 102. In the present embodiment, the weights $W_1$, $W_2$ and $W_3$ can be a binary value ("0" and "1") which represents to the state of the NVM cell 102 operated in one of ON and OFF states. The sum of the terms $X_iW_i$ (i counts from 1 to 3) in the sum-of-products operations is the sum of the voltages $V_n$ of the NVM cells 102.

Figure 8:
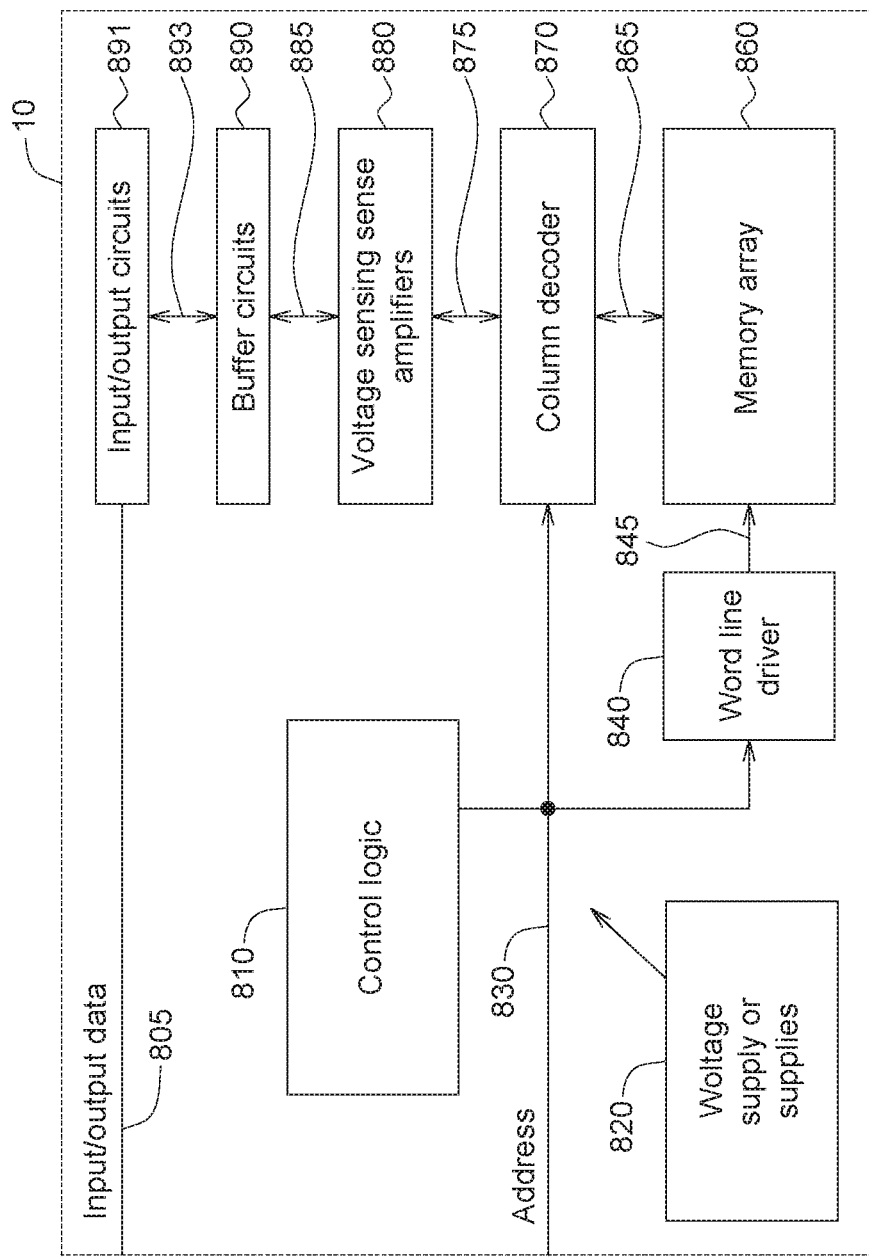
FIG. 8 is a simplified block diagram illustrating an NN system used for performing sum-of-products operations.

FIG. 8 is a simplified block diagram illustrating an NN system 10 used for performing sum-of-products operations. In the NN system 10, a word line driver 840 is coupled to a plurality of word lines 845. The word line driver 840 includes digital-to-analog converters, in some embodiments, that produce an variable input $X_i$ for each selected word line, or in the alternative a binary word line driver that can be apply binary inputs. A column decoder 870 is coupled via lines 865 to one or more layers of memory strings constituted by a plurality of NVM cells 102 connected in series and arranged along columns in a memory array 860 for selecting memory strings for reading sum-of-products data from and writing parameter data to the memory array 860. The memory array 860 can include a NAND flash array, an SRAM array, a DRAM array, a NOR flash array, or other type of memory.

Addresses are supplied on bus 830 from control logic (controller) 810 to column decoder 870 and word line driver 840. Voltage sensing sense amplifiers 880 are coupled to the column decoder via lines 875, and are in turn coupled to buffer circuits 890. Current sources applying the load currents $I_n$ are coupled with the sensing circuits. A program buffer can be included with the voltage sensing sense amplifiers 880 to store program data for two-level or multiple-level programming of the NVM cells 102. Also, the control logic 810 can include circuits for selectively applying program and inhibit voltages to the memory strings in response to the program data values in the program buffer.

Sensed data from the voltage sensing sense amplifiers 880 are supplied via second data lines 885 to buffer circuits 890, which is in turn coupled to input/output circuits 891 via a data path 893. The voltage sensing sense amplifiers 880 can comprise operational amplifiers configured to apply unity gain or a desired gain level, and provide analog outputs to digital-to-analog converters or other signal processing or signal routing circuits. Additional arithmetic units and routing circuits can be included to provide for arrangement of multiple layers of memory cells strings into neuromorphic circuits. Also, arithmetic units and routing circuits can be included to provide for arrangement of the layers of memory cells strings into matrix multiplication units.

Input/output circuits 891 drive the data to destinations external to the NN system 10. Input/output data and control signals are moved via data bus 805 between the input/output circuits 891, the control logic 810 and input/output ports on the NN system 10 or other data sources internal or external to the NN system 10, such as a general purpose processor or special purpose application circuitry, or a combination of modules providing system-on-a-chip functionality supported by the memory array 860.

In the example shown in FIG. 8, control logic 810, using a bias arrangement state machine, controls the application of supply voltages generated or provided through the voltage supply or supplies 820, for sum-of-products read operations, and parameter writing operations to set parameters, such as cell weights, represented by charge trapping levels including, for charge trapping cells and floating gate cells, erase, verify and program bias voltages. The control logic 810 is coupled to the buffer 890 and the memory array 860.

The control logic 810 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

In accordance with the aforementioned embodiments of the present disclosure, an NN system having a plurality of NVM cells strings and used to perform sum-of-products operations is provided. By applying different bias voltages to a doping well in which the NVM cells strings are formed during different operations (e.g. during the programing or reading operations for acquiring the threshold voltages of the NVM cells or the sum-of-products operations) to alter a variable resistance of the buried channel layer, the resistance of the NVM cells strings can be increased during the programing or reading operations, and the resistance of the NVM cells strings can be decreased during the sum-of-products operations. As a result, the difference of the OFF-state current and the On-state current of the NVM cells can be enlarged and a wider read window during the programing or reading operations for determine the threshold voltage of the NVM cells can be obtained. Alternatively, the resistance of the NVM cells strings can be decreased during the sum-of-products operations, and the sensing current can be significantly increased to improve the speed of the sum-of-products.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A neural network (NN) system used to perform sum-of-products operations comprising:
   an non-volatile memory (NVM) device, comprising:
      a substrate,
      a first doping well, having a first conductivity and disposed in the substrate;
      a memory cells string, comprising a plurality of NVM cells electrically connected in series, wherein each of the NVM cells has a gate a source and drain, the source and the drain disposed in the first doping well are separated from each other and both have a second conductivity; and
      a buried channel layer, having the second conductivity and disposed in the first doping well to make the source and the drain disposed between the gate and the buried channel layer;
   a word line driver, electrically connected to the gate of each NVM cells to apply a plurality of input voltages corresponding to a plurality of input variations of terms in the sum-of-products operations;
   a voltage sensing circuit, connected to the memory cells string to apply a constant current into the memory cells string and to sensing a voltage of the memory cells string; and
   a controller, used to program or read the NVM cells for acquiring a plurality of threshold voltages, wherein the sensed voltage and the threshold voltages correspond to weights of the terms in the sum-of-products operations;

when the threshold voltages of the NVM cells are programed or read, a first bias voltage is applied to the first doping well for increasing a variable resistance of the buried channel layer; and when the step of sensing the voltage of the memory cells string is performed, a second bias voltage is applied to the first doping well for reducing the variable resistance.

2. The NN system according to claim 1, further comprising a second doping well formed in the substrate and surrounding the first doping well;

while the first bias voltage is applied to the first doping well, a third bias voltage is applied to the second doping well; and while the second bias voltage is applied to the first doping well, a fourth bias voltage is applied to the second doping well, wherein the third bias voltage is greater than the first bias voltage; and the fourth bias voltage is greater than the second bias voltage.

3. The NN system according to claim 1, further comprising a doping guard layer having the first conductivity, formed in the first doping well, and disposed between the buried channel layer and the source as well as the drain.

4. The NN system according to claim 1, wherein the first bias voltage ranges from −2V to the second bias voltage.

5. The NN system according to claim 1, wherein the NVM device is an NAND flash memory device.

6. A method for controlling an NN system used to perform sum-of-products operations comprising:

providing an NVM device, comprising:

a substrate, a first doping well, having a first conductivity and disposed in the substrate;

a memory cells string, comprising a plurality of NVM cells electrically connected in series, wherein each of the NVM cells has a gate a source and drain, the source and the drain disposed in the first doping well are separated from each other and both have a second conductivity; and a buried channel layer, having the second conductivity and disposed in the first doping well to make the source and the drain disposed between the gate and the buried channel layer;

providing a word line driver electrically connected to the gate of each NVM cells to apply a plurality of input voltages corresponding to a plurality of input variations of terms in the sum-of-products operations;

providing a voltage sensing circuit connected to the memory cells string to apply a constant current into the memory cells string and to sensing a voltage of the memory cells string;

providing a controller to program or read the NVM cells for acquiring a plurality of threshold voltages, wherein the sensed voltage and the threshold voltages correspond to weights of the terms in the sum-of-products operations;

when the NVM cells are programed or read, a first bias voltage is applied to the first doping well for increasing a variable resistance of the buried channel layer; and when the step of sensing the voltage of the memory cells string is performed, a second bias voltage is applied to the first doping well for reducing the variable resistance.

7. The method according to claim 6, wherein the step of providing the NVM device further comprising providing a second doping well formed in the substrate and surrounding the first doping well;

while the first bias voltage is applied to the first doping well, a third bias voltage is applied to the second doping well; and while the second bias voltage is applied to the first doping well, a fourth bias voltage is applied to the second doping well, wherein the third bias voltage is greater than the first bias voltage, and the fourth bias voltage is greater than the second bias voltage.

* * * * *